United States Patent [19]
Anzai

[11] Patent Number: 5,414,277
[45] Date of Patent: May 9, 1995

[54] THIN FILM TRANSISTOR WHICH PREVENTS GENERATION OF HOT CARRIERS

[75] Inventor: Kenji Anzai, Sagamihara, Japan

[73] Assignee: Nippon Steel Corporation, Japan

[21] Appl. No.: 239,271

[22] Filed: May 2, 1994

Related U.S. Application Data

[62] Division of Ser. No. 936,247, Aug. 27, 1992.

[30] Foreign Application Priority Data

Aug. 28, 1991 [JP] Japan .................................. 3-242616

[51] Int. Cl.⁶ ...................... H01L 29/04; H01L 29/78; H01L 27/02; H01L 49/00
[52] U.S. Cl. ................................. 257/69; 257/204; 257/365; 257/366; 257/368; 257/315; 257/903
[58] Field of Search ............... 257/368, 365, 67, 359, 257/339, 409, 903, 356, 357, 369, 324, 321, 315, 366, 69, 204

[56] References Cited

U.S. PATENT DOCUMENTS

| | | |
|---|---|---|
| 4,566,175 | 1/1986 | Smayling et al. .................. 257/413 |
| 4,775,642 | 10/1988 | Chang et al. ....................... 257/315 |
| 4,811,078 | 3/1989 | Tigelaar et al. ...................... 357/54 |
| 4,878,100 | 10/1989 | McDavid .............................. 257/408 |
| 4,980,732 | 12/1990 | Okazawa ............................ 357/23.5 |
| 5,001,540 | 3/1991 | Ishihara ............................... 257/409 |
| 5,220,182 | 6/1993 | Matsuoka et al. .................... 257/67 |

FOREIGN PATENT DOCUMENTS

63-120455  5/1988  Japan ..................... 257/67

OTHER PUBLICATIONS

A 5.9 μm² Super Low Power SRAM Cell Using a New Phase-Shift Lithography, Yamanaka et al. IEEE IEDM.
A Polysilicon Transistor Technology for Large Capacity SRAMs (Invited paper) S. Ikeda, S. Hashiba, I. Kuramoto, H. Katoh, T. Yamanaka, T. Hashimoto, N. Hashimoto and S. Meguro, Hitachi, Ltd. Tokyo, Japan 1990 IEEE IEDM 90-469-472.

*Primary Examiner*—Sara W. Crane
*Assistant Examiner*—T. M. Arroyo
*Attorney, Agent, or Firm*—Pollock, Vande Sande & Priddy

[57] ABSTRACT

A semiconductor transistor device comprises a gate electrode disposed over an insulating surface, a spacer element located at the end of the gate electrode, a gate insulating film covering the gate electrode, a first diffusion region spaced apart from one end of the gate electrode, separated therefrom by the gate insulating film and by the spacer element which reduces the electric field between the gate and first diffusion region, the first diffusion region extending vertically above the gate insulating film, and a second diffusion region disposed above the gate insulating film having one end spaced from the first diffusion vertically extending region.

14 Claims, 3 Drawing Sheets

5,414,277

THIN FILM TRANSISTOR WHICH PREVENTS GENERATION OF HOT CARRIERS

This application is a divisional of application Ser. No. 07/936,247 filed Aug. 27, 1992.

FIELD OF THE INVENTION

The present invention relates to a semiconductor device having a thin film transistor (TFT).

BACKGROUND OF THE INVENTION

One kind of MOS static RAMs uses a complete CMOS type memory cell. As shown in FIG. 2, this CMOS type memory cell comprises a flip-flop circuit having a first inverter including driver transistor $Q_1$ and load transistor $Q_2$ and a second inverter including driver transistor $Q_3$ and load transistor $Q_4$ in which an input of one inverter is connected with an output of the other inverter, and a pair of access transistors $Q_5$ and $Q_6$ for data communication with an exterior of the cell. In FIG. 2, WL denotes a word line; BL and BL' denote bit lines, respectively; and V denotes a power supply voltage.

In recent years, frequently, the load transistors $Q_2$ and $Q_4$ in the above complete CMOS type memory cell are each formed by a p-channel thin film transistor (TFT: Thin Film Transistor). FIG. 3 shows a cross-section of the main part of the p-channel TFT serving as a load transistor. In FIG. 3, reference numeral 101 denotes an interlayer insulation film; 102 denotes a gate electrode; 103 denotes a gate insulating film; and 104 denotes a polycrystalline silicon (hereinafter referred to as polysilicon) film. It should be noted that the polysilicon film 104 is formed so as to cover an end portion of the gate electrode 102. The polysilicon film 104 includes a $p^+$-type source region 105 and a $p^+$-type drain region 106. The gate electrode 102, source region 105 and drain region 106 constitute a p-channel TFT serving as a load transistor.

In known CMOS type memory cell, as shown in FIG. 3, the drain region 106 of the p-channel TFT serving as a load transistor is usually formed so that its end portion is close to the end portion of the gate electrode 102. For this reason, hot carriers are generated during operation by the electric field between the end portion of the gate electrode 102 and the drain region 106, resulting in deterioration of the characteristic of the p-channel TFT as a load transistor.

SUMMARY OF THE INVENTION

An object of the present invention, therefore, is to provide a semiconductor device which can prevent generation of hot carriers due to the electric field between the end portion of the gate electrode and the drain region of the thin film transistor, thereby preventing deterioration of the characteristic of the thin film transistor.

In order to achieve the above purpose, in accordance with the present invention, there is provided a semiconductor device comprising a thin film transistor having a gate electrode and a semiconductor thin film formed so as to cover at least an end portion of the gate electrode through a gate insulating film. A side wall spacer is provided on a side wall of at least the end portion of said gate electrode.

In the semiconductor device according to a preferred embodiment of the present invention, a side wall spacer is provided on the side wall of at least the end portion of the gate electrode, and the distance between the gate electrode and a drain region formed in the semiconductor thin film is increased by the width of the side wall spacer. Thus, in operation, the electric field between the end portion and the drain region can be reduced. This prevents generation of hot carriers due to the electric field between the end portion of the gate electrode and the drain region, and prevents deterioration in the characteristic of the thin film transistor.

BRIEF DESCRIPTION OF THE DRAWINGS

One preferred embodiment of the present invention is described in the following with reference being made to the accompanying drawings.

DETAILED DESCRIPTION OF THE PREFERRED EMBODIMENTS

Now referring to FIG. 1, and explanation will be given of an embodiment of the present invention.

Figure 1:
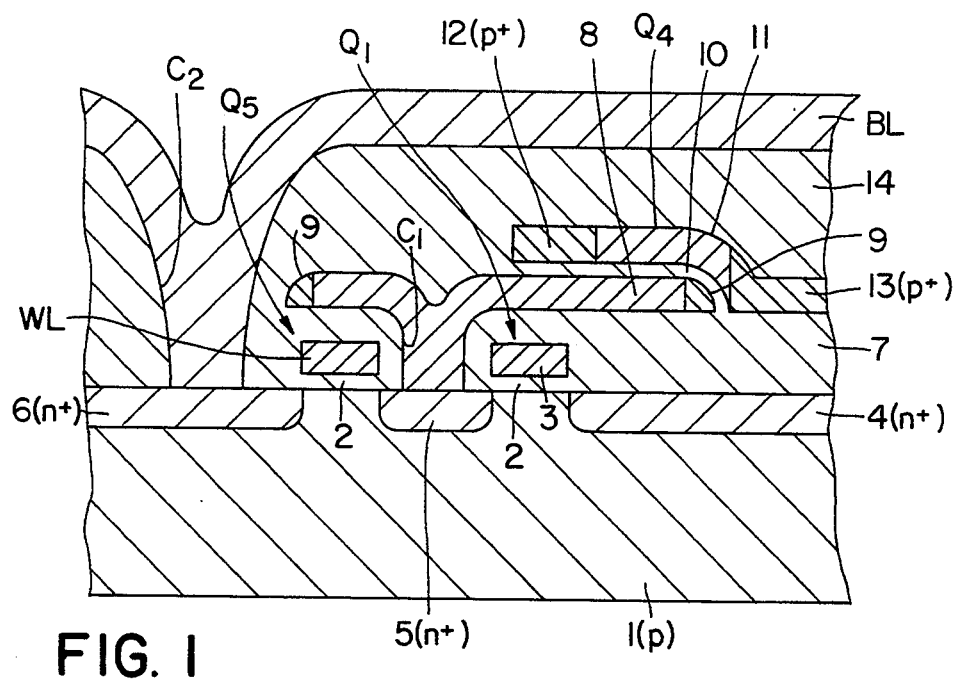
FIG. 1 is a sectional view of a main part of a complete CMOS type static RAM according to one embodiment of the present invention.
Figure 2:
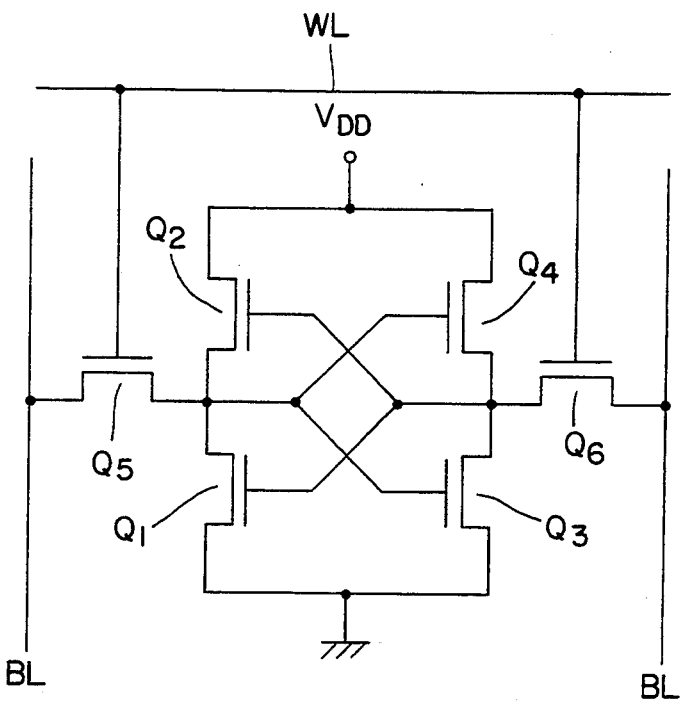
FIG. 2 is circuit diagram of the equivalent circuit of a complete CMOS type memory cell.
Figure 3:
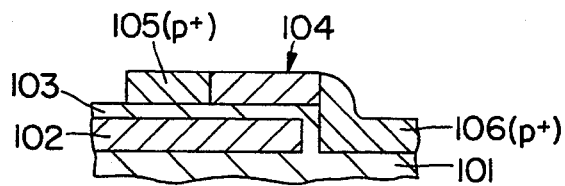
FIG. 3 is a sectional view of the p-channel TFT serving as a load transistor in the conventional CMOS type static RAM.

FIG. 1 is a sectional view showing a main part of a complete CMOS type static RAM according to one embodiment of the present invention. The equivalent circuit of the memory cell of the complete CMOS type static RAM is shown in FIG. 2.

In FIG. 1, reference numeral 1 denotes a p-type silicon (Si) substrate; 2 denotes a gate insulating film made of silicon dioxide ($SiO_2$) film; 3 denotes a gate electrode; and WL denotes a word line. The gate electrode 3 and the word line WL can be formed of e.g. a first layer of polysilicon film or polycide film which is formed by stacking a refractory metal silicide film on the polysilicon film.

Reference numerals 4, 5 and 6 are $n^+$-type diffused layers which are used as source or drain regions. The gate electrode 3 and the diffused layers 4 and 5 constitute and n-channel MOS transistor serving as a driver transistor (e.g., $Q_1$ in FIG. 2.). The word line WL and the diffused layers 5 and 6 constitute and n-channel MOS transistor (e.g., $Q_5$ in FIG. 2) serving as an access transistor.

Reference numeral 7 denotes an interlayer insulating film made of e.g. silicon dioxide film or phospho-silicate glass (PSG) film, and reference numeral 8 denotes a gate electrode. This gate electrode 8 is formed by e.g. a second layer of polysilicon film or polycide film which is e.g., about 3000 Å thick. The gate electrode 8 is kept in contact with the diffused layer 5 through a contact hole $C_1$ formed in the interlayer insulating film 7.

In this embodiment, side wall spacers 9 of $SiO_2$ are formed on the side walls of the end portions of the gate electrode 8. These side wall spacers 9 are formed in such a way that after the gate electrode 8 if formed, an SiO2 film is formed on the entire surface of the substrate and the SiO2 film is etched back. The side wall spacers are e.g. about 0.2-0.3 μm wide.

Reference numeral 10 denotes a gate insulating film made of e.g. SiO2 film. The gate insulating film 10 is e.g. 100-300 Å. Reference numeral 11 denotes e.g. a third layer of polysilicon film. The polysilicon film 11 is formed so as to cover an end portion of the gate electrode 8 through the gate insulating film 10. The polysilicon film 11 is e.g. 500-1000 Å. This polysilicon film 11 includes a p+-type source diffusion region 12 and a p-type drain diffusion region 13. The gate electrode 8, the source region 12 and the drain region 13 constitute a p-channel TFT serving as a load transistor (e.g. $Q_4$ in FIG. 2).

Reference numeral 14 denotes an interlayer insulating film of e.g. a PSG film. Reference symbol BL denotes a bit line of e.g. an aluminum film. The bit line BL is kept in contact with the diffused layer 6 (which is the source region of an access transistor (e.g. $Q_5$ in FIG. 2) through the contact hole $C_2$ formed in the interlayer insulating films 7 and 14.

As described above, in the complete CMOS type static RAM according to the embodiment, the side wall spacer 9 is formed on the side wall of the end portion of the gate electrode 8 of the p-channel TFT serving as a load transistor so that the distance between the end portion of the gate electrode 8 and the drain region 13 is made larger by the width of the side wall spacer 9 than that of the prior art. For this reason, during operation, the electric field between the end portion of the gate electrode 8 and the drain region 13 can be reduced. This effectively prevents generation of hot carriers due to the electric field between the end portion of the gate electrode 8 and the drain region 13, thereby preventing deterioration in the characteristic of the p-channel TFT serving as a load transistor, thus improving its reliability.

Further, since the distance between the end portion of the gate electrode 8 and the drain region 13 is controlled by provision of the side wall spacer 9, it can be controlled very easily and with great accuracy.

The method of making side wall spacer 9 will be described in conjunction with FIGS. 4A to 4D.

Figure 4A:
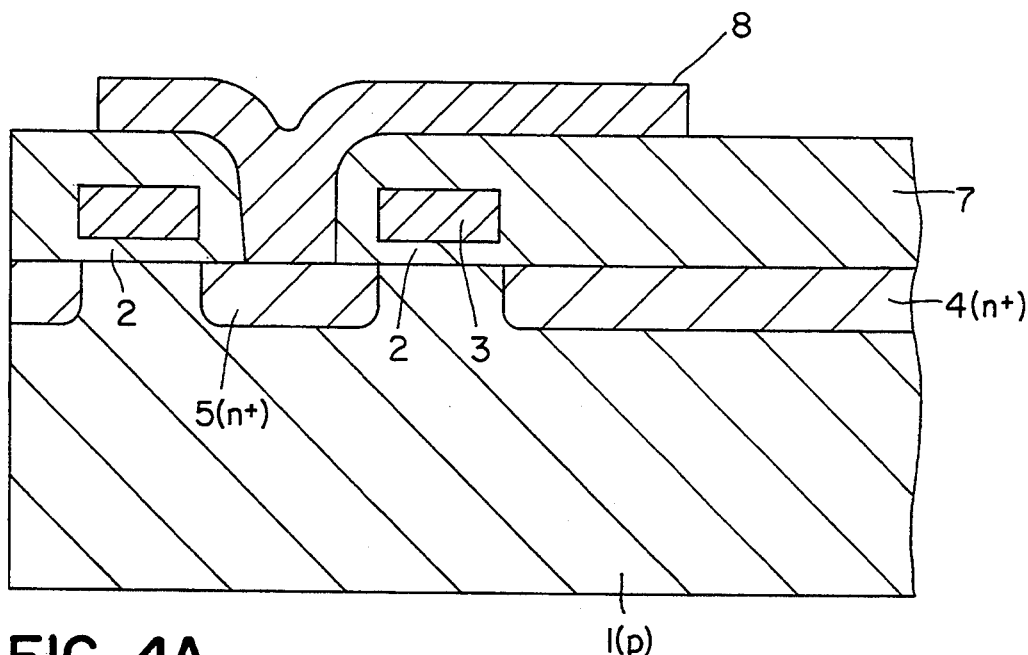
FIG. 4A illustrates the first step in a method of making the embodiment shown in FIG. 1.
Figure 4B:
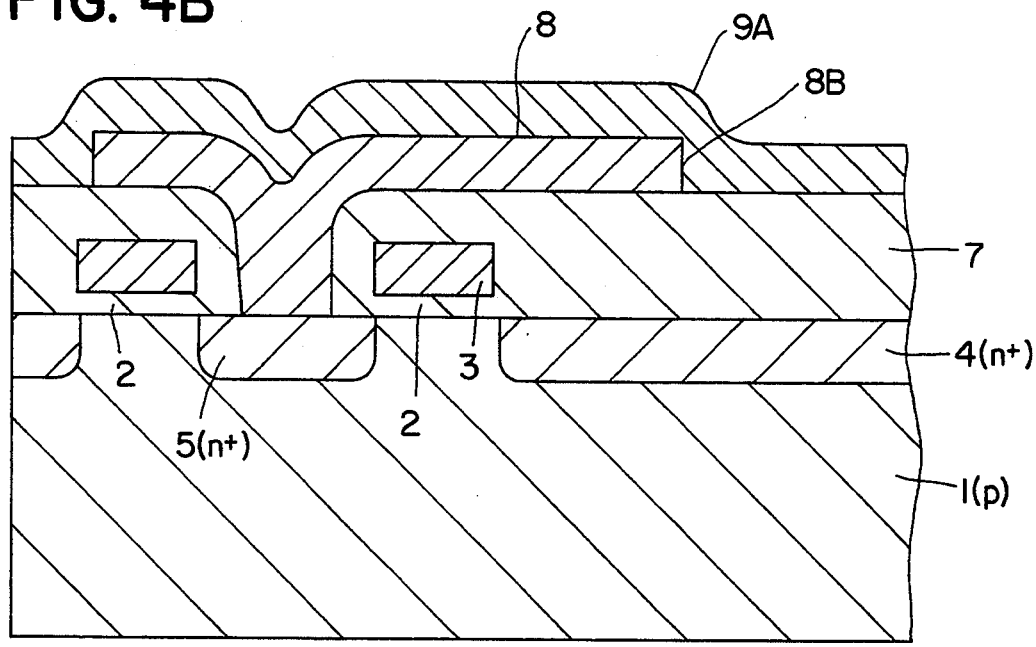
FIG. 4B illustrates an intermediate step for forming a spacer element between the gate electrode and drain region.
Figure 4C:
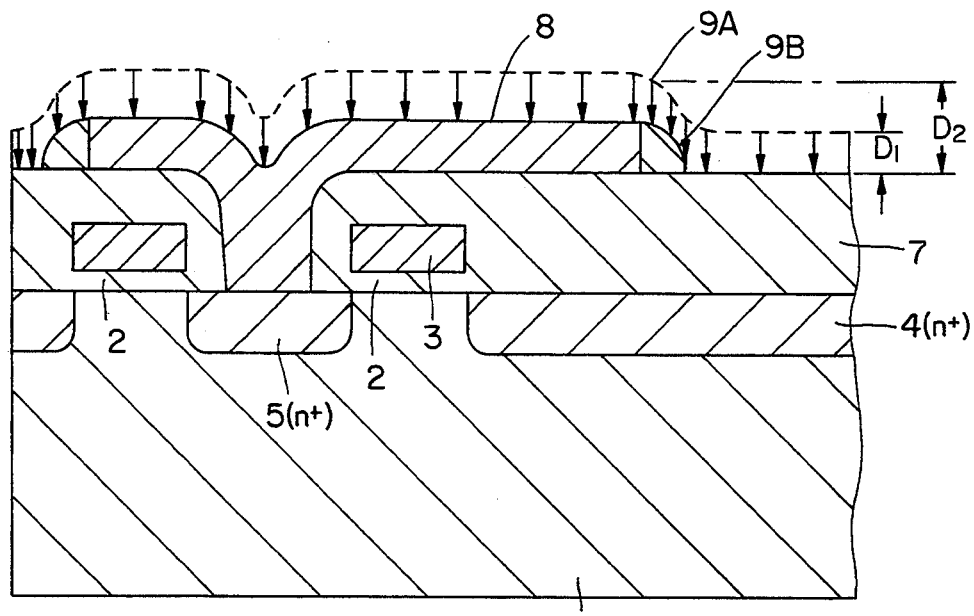
FIG. 4C illustrates the etching step in forming the spacer element.
Figure 4D:
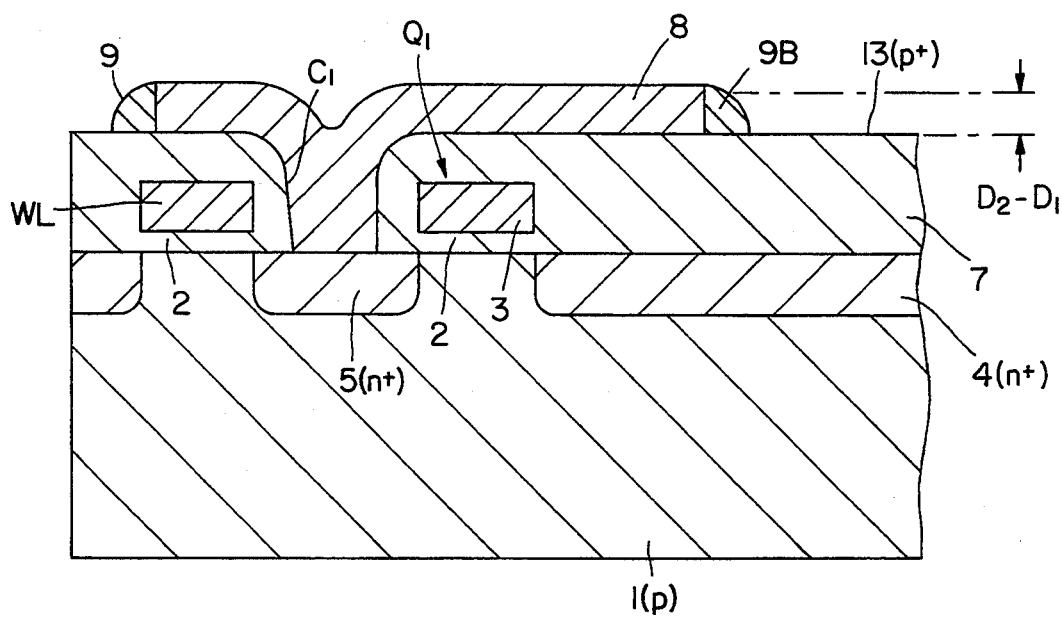
FIG. 4D illustrates the resulting structure following etching of FIG. 4C.

As shown in FIG. 4A, a gate electrode 8 is formed on n+-type diffusion layer 5 and insulating film 7. As shown in FIG. 4B, an insulating film 9A such as SiO2 is deposited by CVD (Chemical Vapor Deposition) on the entire surface of a wafer at a substantially constant thickness D1 of 0.2 to 0.3 μm corresponding to that of the side wall spacer to be made. The gate electrode 8 and end portion of the gate electrode 8 are covered by the insulating film 9A. The portion of the insulating film 9A at the end portion 8B of the gate electrode 8 forms a transition region of depth D2 which is deeper than the depth D1 of the other portion of the insulation film 9A. The entire wafer surface is then subjected to anisotropic etching to etch the insulating film 9A. The etching depth is set to D1, represented by the length of arrows in FIG. 4C, and is uniform over all surfaces. After the etching, the portions of the insulating film 9B which exceeds the depth D1, i.e. D2−D1, is left at the step portions, i.e. at the transition adjacent the end portion of the gate electrode so as to form the side wall spacer 9B as shown in FIG. 4D.

Although only one embodiment of the present invention has been explained in detail, the present invention has been explained concretely, the present invention should not be limited to the above embodiment.

For example, in the above embodiment, the present invention is applied to a complete CMOS type static RAM in which the load transistor of a memory cell is constructed by a TFT. However, the present invention can also be applied to various kinds of semiconductor devices including the TFT.

As described above, in accordance with the present invention, since a side wall spacer is provided on the side wall of at least an end portion of the gate electrode of a thin film transistor (TFT), it is possible to prevent generation of hot carriers due to the electric field between the end portion of the gate electrode and the drain region, thereby preventing deterioration in the characteristic of the thin film transistor.

I claim:
1. A semiconductor transistor device comprising:
 (a) a gate electrode disposed over an insulating surface;
 (b) a gate insulating film covering said gate electrode;
 (c) a first diffusion region spaced apart from one end of said gate electrode, and separated from said gate electrode by said gate insulating film, the first diffusion region extending vertically above said gate insulating film;
 (d) a spacer element located at the one end of said gate electrode and covered by said gate insulating film, said spacer element and gate insulation films determining the distance between said gate electrode and first diffusion region, for reducing an electric field between said gate electrode and said first diffusion region; and,
 (e) a second diffusion region disposed above said gate insulating film and having one end spaced from said first diffusion region.

2. A semiconductor device of claim 1 wherein said spacer element is in contact with said gate electrode one end.

3. A semiconductor transistor device comprising:
 (a) a gate electrode disposed over an insulating surface;
 (b) a gate insulating film covering said gate electrode;
 (c) a semiconductor thin film disposed over said insulating surface, and said gate electrode, and separated therefrom by said gate insulating film;
 (d) a first diffusion region in said semiconductor thin film spaced apart from one end of said gate electrode, and separated from said gate electrode by said gate insulating film, the first diffusion region extending vertically above said gate insulating film;
 (e) a spacer element located at one end of said gate electrode and said first diffusion region which determines with said gate insulating film the distance between sid first diffusion region and said gate electrode for reducing an electric field between said gate electrode and said first diffusion region; and,
 (f) a second diffusion region in said semiconductor thin film disposed above said gate insulating film and having one end spaced from said first diffusion region.

4. A semiconductor device of claim 3 wherein said spacer element is covered by said gate insulating film.

5. A semiconductor device of claim 3 wherein said spacer element is in contact with said gate electrode one end.

6. A semiconductor transistor device comprising:
a gate electrode disposed over an insulating surface;
a first diffusion region spaced apart from one end of said gate electrode;
means located between said first diffusion region and said gate electrode for reducing the electrical field between said electrode one end and said first diffusion region;
a gate insulating film covering said gate electrode; and
a second diffusion layer disposed over said gate insulating film, extending towards a vertically extending portion of said first diffusion region.

7. The semiconductor transistor of claim 6 wherein said gate insulating film covers said means for reducing the electric field.

8. The semiconductor transistor of claim 6 wherein said means for reducing the electric field is in contact with said gate electrode one end.

9. A semiconductor transistor device comprising:
a gate electrode disposed over an insulating surface;
a first diffusion region spaced apart from one end of said gate electrode forming a drain region;
a gate insulating film covering said gate electrode;
a spacer element located between said first diffusion region and the one end of said gate electrode so that a distance between said first diffusion region and the one end of said gate electrode is substantially determined by said spacer element and said gate insulating film; and,
a second diffusion region disposed over said gate insulating film, extending towards a vertically extending portion of said first diffusion region forming a source.

10. The semiconductor transistor of claim 6 wherein said gate insulating film covers said means for reducing the electric field.

11. The semiconductor transistor of claim 6 wherein said means for reducing the electric field is in contact with said gate electrode one end.

12. A semiconductor transistor device comprising:
(a) a gate electrode disposed over an insulating surface;
(b) a gate insulating film covering said gate electrode;
(c) a semiconducting film disposed over said insulating surface and said gate electrode and separated from said gate electrode by said gate insulating film;
(d) a drain formed in a first region of said semiconductor thin film spaced apart from one end of said gate electrode by said gate insulating film, extending to an area over said gate insulating film;
(e) a spacer element located between said drain region and gate electrode, which determines the distance between said drain and gate electrode, for reducing an electric field between said drain and gate electrode; and,
(f) a source formed in a second region of said semiconducting film located above said gate electrode and spaced from said drain region.

13. The semiconductor transistor device of claim 12 wherein said insulating film covers said spacer element.

14. The semiconductor transistor device of claim 13 wherein said spacer element abuts one end of said gate electrode.

* * * * *